United States Patent
Puetz et al.

(10) Patent No.: US 7,872,252 B2
(45) Date of Patent: Jan. 18, 2011

(54) METHOD OF FABRICATING SEMICONDUCTOR DEVICES ON A GROUP IV SUBSTRATE WITH CONTROLLED INTERFACE PROPERTIES AND DIFFUSION TAILS

(75) Inventors: Norbert Puetz, Kanata (CA); Simon Fafard, Orleans (CA); Bruno J. Riel, Ottawa (CA)

(73) Assignee: Cyrium Technologies Incorporated, Ottawa, Ontario (CA)

(*) Notice: Subject to any disclaimer, the term of this patent is extended or adjusted under 35 U.S.C. 154(b) by 298 days.

(21) Appl. No.: 11/776,163

(22) Filed: Jul. 11, 2007

(65) Prior Publication Data
US 2008/0035939 A1   Feb. 14, 2008

Related U.S. Application Data

(60) Provisional application No. 60/822,138, filed on Aug. 11, 2006.

(51) Int. Cl.
*H01L 21/20* (2006.01)

(52) U.S. Cl. .......................... 257/13; 257/94; 257/184; 257/461

(58) Field of Classification Search .................. 257/13, 257/461, 431, 464, 94, 184
See application file for complete search history.

(56) References Cited

U.S. PATENT DOCUMENTS

| | | | | |
|---|---|---|---|---|
| 4,910,167 A | * | 3/1990 | Lee et al. | 117/96 |
| 5,130,269 A | * | 7/1992 | Kitahara et al. | 117/89 |
| 5,484,664 A | * | 1/1996 | Kitahara et al. | 428/641 |
| 6,340,788 B1 | * | 1/2002 | King et al. | 136/261 |
| 6,380,601 B1 | | 4/2002 | Ermer et al. | |
| 6,813,296 B2 | | 11/2004 | Goyal et al. | |
| 6,849,882 B2 | | 2/2005 | Chavarkar et al. | |
| 6,900,067 B2 | | 5/2005 | Kobayashi et al. | |

(Continued)

OTHER PUBLICATIONS

Kawai et al., "Ge segregation and its suppression in GaAs epilayers grown on Ge(111) substrate", Applied Physics Letters, vol. 61, No. 10, Sep. 7, 1992, pp. 1216-1218, XP002540613.

(Continued)

*Primary Examiner*—A. Sefer
(74) *Attorney, Agent, or Firm*—Louis B. Allard; Borden Ladner Gervais LLP

(57) ABSTRACT

Electronic and opto-electronic devices having epitaxially-deposited III/V compounds on vicinal group IV substrates and method for making same. The devices include an AlAs nucleating layer on a Ge substrate. The group IV substrate contains a p-n junction whose change of characteristics during epitaxial growth of As-containing layers is minimized by the AlAs nucleating layer. The AlAs nucleating layer provides improved morphology of the devices and a means to control the position of a p-n junction near the surface of the group IV substrate through diffusion of As and/or P and near the bottom of the III/V structure through minimized diffusion of the group IV element.

16 Claims, 15 Drawing Sheets

U.S. PATENT DOCUMENTS

| | | | |
|---|---|---|---|
| 6,996,150 | B1 | 2/2006 | Shakuda |
| 7,001,791 | B2 | 2/2006 | Kryliouk et al. |
| 7,038,284 | B2 | 5/2006 | Haukka et al. |
| 2002/0040727 | A1 | 4/2002 | Stan et al. |
| 2002/0059898 | A1* | 5/2002 | Landini et al. ............... 117/84 |
| 2002/0119680 | A1* | 8/2002 | Wang et al. ............... 438/962 |
| 2002/0167023 | A1* | 11/2002 | Chavarkar et al. .......... 257/194 |
| 2004/0045598 | A1* | 3/2004 | Narayanan et al. .......... 136/255 |
| 2004/0079408 | A1* | 4/2004 | Fetzer et al. ............... 136/262 |
| 2005/0155641 | A1* | 7/2005 | Fafard ....................... 136/249 |
| 2008/0206966 | A1* | 8/2008 | Huffaker et al. ........... 438/479 |

OTHER PUBLICATIONS

Takamoto et al., "InGaP/GaAs-based Multijunction Solar Cells", Progress in Photovoltaics: Research and Applications, vol. 13, No. 6, Sep. 1, 2005, pp. 495-511, XP002540614.

European Patent Application No. 07763924.3, Search Report dated Sep. 16, 2009.

Fitzgerald et al., "Necessity of Ga prelayers in GaAs/Ge growth using gas-source molecular beam epitaxy", Appl. Phys, Lett., vol. 64 (6), Feb. 7, 1994, pp. 733-735.

European Patent Application No. 07763924.3 Office Action dated May 3, 2010.

* cited by examiner

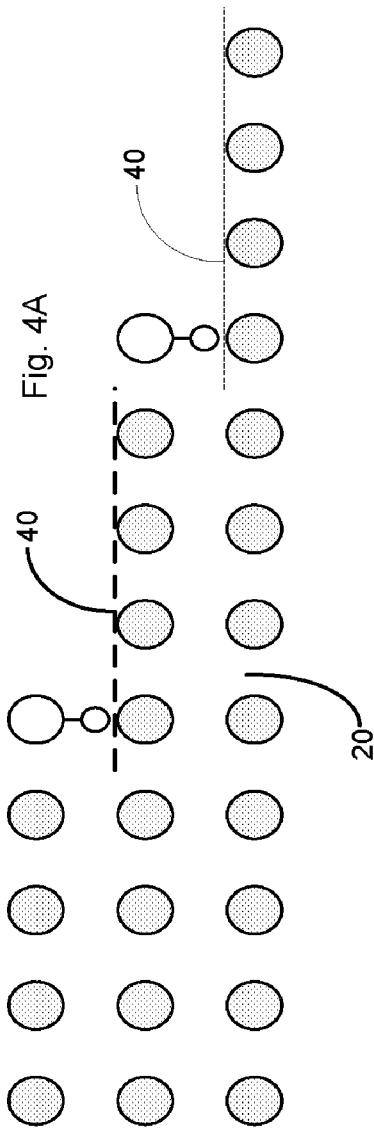

Fig. 4A

At the start of the deposition process the small Al atoms quickly find the energetically preferred steps and kinks, thus laying down the pattern for the III-V semiconductor film

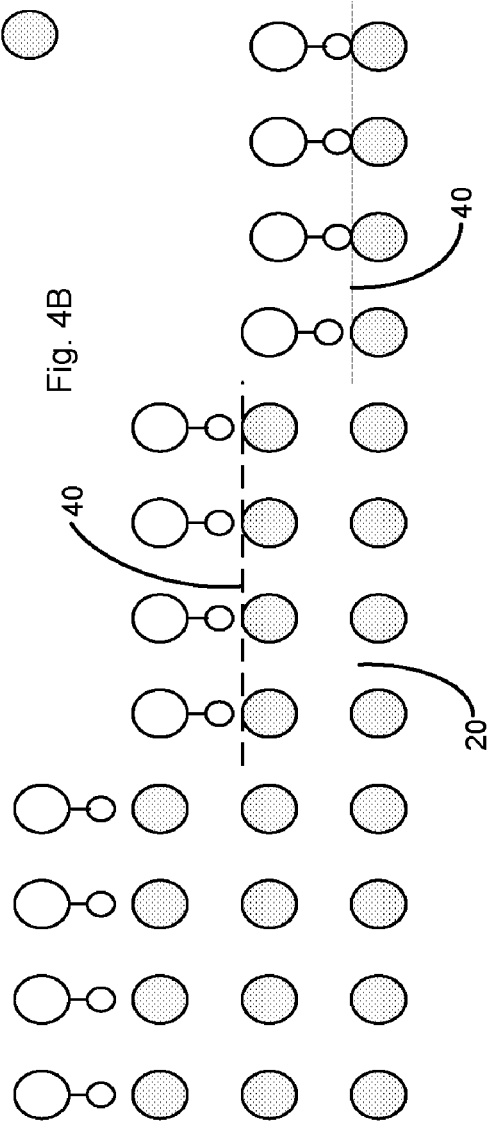

Fig. 4B

After the deposition of a monolayer of AlAs all steps have been covered and the transition from non-polar to polar crystal has been created. This nucleation process occurs at temperatures which are typical for the deposition of AlAs epitaxial layers

METHOD OF FABRICATING SEMICONDUCTOR DEVICES ON A GROUP IV SUBSTRATE WITH CONTROLLED INTERFACE PROPERTIES AND DIFFUSION TAILS

This application claims the benefit of priority of U.S. Provisional Patent Application No. 60/822,138 filed Aug. 11, 2006, which is incorporated herein by reference.

FIELD OF THE INVENTION

The present invention relates generally to the epitaxial deposition of electronic and opto-electronic devices. More particularly, the present invention relates to the deposition of III/V electronic and opto-electronic device structures on group IV substrates.

BACKGROUND OF THE INVENTION

The deposition of layer sequences for III/V opto/electronic devices, such as multi-junction solar cells and light-emitting diodes (LEDs), on group IV substrates is known. The electronic and optical properties of such devices are being studied extensively and the correlation between these properties and the characteristics of the substrate-epilayer interface is receiving great attention. The reason for the attention given to the substrate-epilayer interface is that, for the most part, the performance of these devices is determined by the quality of this interface.

When depositing a III/V material, for example GaAs, epitaxially on a group IV substrate, for example Ge, the formation of the appropriate atomic layer sequence of the group III and group V layers is not readily established. The group IV sites (Ge atoms) can bond either group III or group V atoms. In practice, some areas of the group IV substrate will bond group III atoms and some other areas will bond group V atoms. The boundary regions between these different growth areas give rise to considerable structural defects, such as anti-phase domains, which adversely affect the performance of the device.

To curtail some of these undesired events, the group IV substrates are usually vicinal substrates with an off-cut angle ranging from 0-15°. These vicinal substrates offer terraces and step edges where the atoms can attach with different bond configurations, thus providing greater order in the growth process.

In devices such as, for example, solar cells having III/V compounds epitaxially deposited on a group IV substrate, it is often desirable to create part of the device itself in the group IV substrate by diffusing, for example, a group V species in the group IV substrate. As an example, for solar cells, if a group V element is diffused in a p-type Ge substrate, an n-type region is formed, giving rise to a p-n junction. This p-n junction becomes photo-active and can be part of a single or multijunction solar cell. However, when depositing the III/V compound at typical process temperatures (500-750° C.) on the Ge substrate, the group V element of the compound tends to diffuse, with little control, in the substrate thereby making the formation of a predictable p-n junction difficult. In cases involving Ge substrates with a pre-existing p-n junction, as could be the case in the hetero-integration of III-V opto/electronics on Ge, SiGe and SiC electronic circuits, the deposition of an overlaying III/V compound can modify the doping profile of the pre-existing p-n junction resulting in subpar performance of the p-n junction and device. Consequently, the electrical characteristics are not easily controllable. In such situations, it can become quite difficult, if not impossible, to attain and maintain the desired doping profile and the electrical characteristics of the substrate's p-n junction, such electrical characteristics including, in the case of solar cells, the open circuit voltage (Voc). Furthermore, group IV atoms will diffuse from the substrate into the epitaxially deposited III/V layers. Hence, layers within the initial 0.5-1 µm of the III/V layer sequence can be highly doped with the group IV element when the excessive diffusion of group IV atoms is not curtailed through the use of suitable nucleation conditions and materials. Group IV atoms like Si and Ge are, at moderate concentrations, typically n-type dopants in III/V semiconductor material. However, due to their amphoteric nature these atoms can cause a large degree of compensation (combined incorporation of n- and p-type impurities) when incorporated at concentrations much larger than $2 \times 10^{18}$ cm$^{-3}$, often leading to a strong deterioration of electrical and optical properties of the host semiconductor layer.

U.S. Pat. No. 6,380,601 B1 to Ermer et al., hereinafter referred to as Ermer, teaches deposition of GaInP on an n-doped interface layer on a p-type Ge substrate and subsequent deposition of a GaAs binary compound on the GaInP layer. The phosphorous of the GaInP layer tends to not diffuse in the Ge substrate as deeply as the arsenic of a GaAs layer would. Thus, the phosphorous doping and subsequent deposition of the GaInP layer allows better control of the doping profile of the n-type layer of the Ge substrate and consequently, leads to a better control of the electrical characteristics of the p-n junction formed in the Ge substrate. However, the problem with having a GaInP interfacial layer at the Ge substrate interface is that the morphology of devices prepared under typical epitaxial process conditions for these materials is not ideal: defects often abound. It would appear that extreme nucleation conditions (temperature, deposition rate, group V overpressure) of the GaInP interfacial layer are required in order to obtain devices with suitable morphology.

It is, therefore, desirable to provide a method for fabricating semiconductor devices having a III/V compound epitaxially deposited on a group IV substrate under typical epitaxial process conditions, the devices having a suitable morphology and the method allowing better control over the optical and electrical interface properties as well as the diffusion layer in the group IV substrate.

SUMMARY OF THE INVENTION

It is an object of the present invention to obviate or mitigate at least one disadvantage of previous devices having epitaxial III/V layers on a group IV substrate.

In a first aspect, the present invention provides a semiconductor device comprising a group IV layer; and a nucleating layer formed on the group IV layer. The nucleating layer includes a III-V compound having at least aluminum (Al) as a group III element and at least one of arsenic (As), nitrogen (N) and antimony (Sb) as a group V element.

In a second aspect, the present invention provides a method of fabricating a semiconductor structure on a group IV layer. The method comprises a step of forming a nucleating layer on the group IV layer, the nucleating layer including a III-V compound having at least aluminum (Al) as a group III element and at least one of arsenic (As), nitrogen (N) and antimony (Sb) as a group V element. The method further comprises a step of forming a first III-V compound layer on the nucleating layer.

In a third aspect, the present invention provides a method of controlling the doping profile of a p-n junction formed in a group IV substrate. The method comprises a step of forming a nucleating layer on the group IV substrate, the nucleating layer including a III-V compound having at least aluminum (Al) as a group III element and at least one of arsenic (As), nitrogen (N) and antimony (Sb) as a group V element. The method further comprises a step of forming a III-V compound layer on the nucleating layer, the nucleating layer for controlling the diffusion of group V elements into the group IV substrate and for controlling the diffusion of group IV elements out of the group IV substrate.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 4 is a depiction of the deposition process of AlAs on a vicinal Ge substrate;

DETAILED DESCRIPTION

Generally, the present invention provides a method for fabricating electronic or opto-electronic devices having a group IV substrate on which a III/V layer structure is deposited. The method allows for the manufacturing of devices with improved morphology and controlled doping profiles of group V constituents into the group IV substrate and group IV constituents into the III/V layers.

Figure 1:
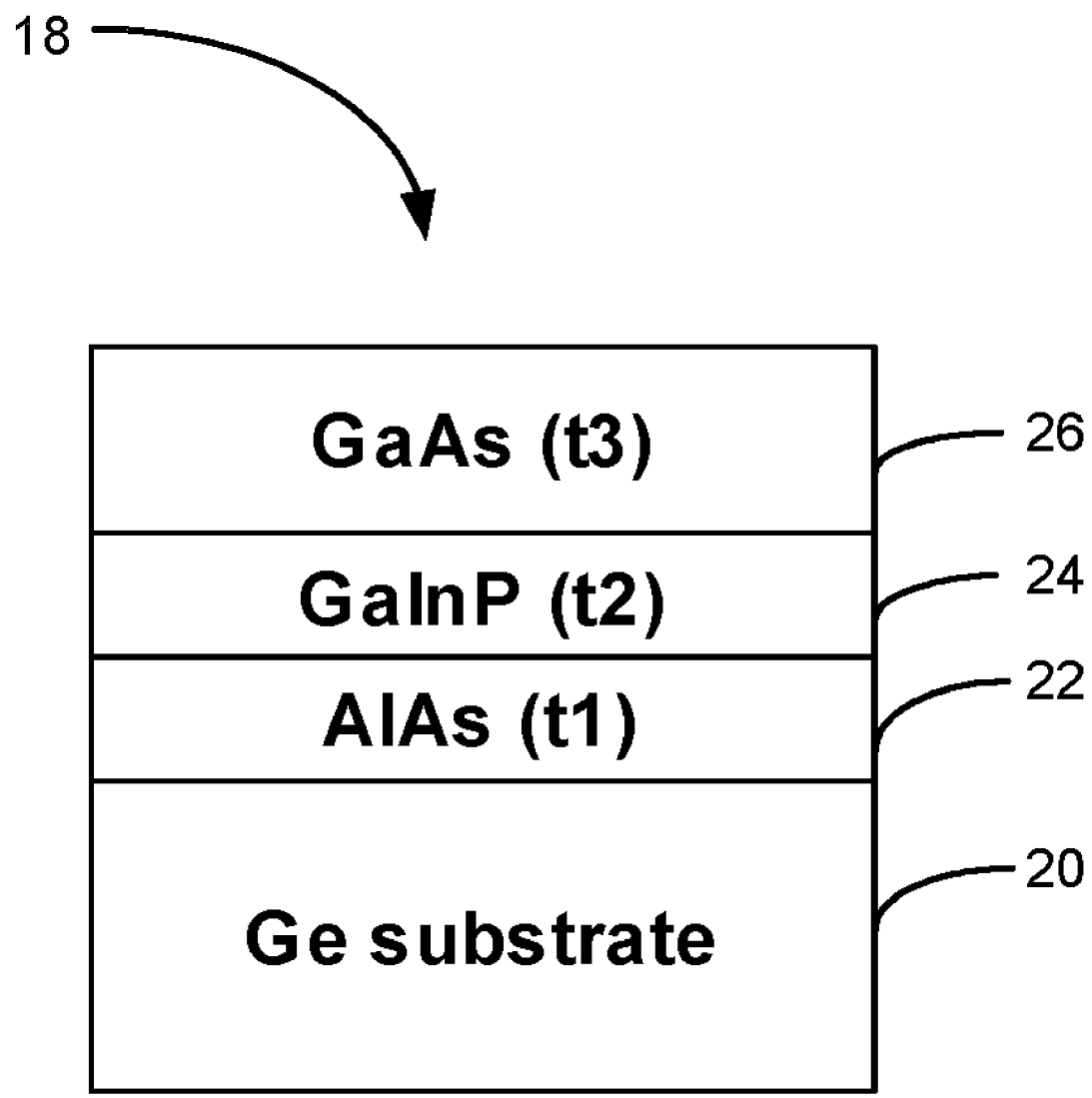
FIG. 1 is a side view of an embodiment of the present invention.

FIG. 1 shows an exemplary three junction semiconductor structure 18 embodying the present invention. Such a structure can be used in multi-junction solar cells, e.g., three junction solar cells. Further, as will be readily understood by a worker skilled in the art, similar structures can be used in light-emitting diodes (LEDs) and other electronic and/or opto-electronic devices. An AlAs layer 22 of thickness $t_1$ is deposited atop a vicinal Ge substrate 20. As will be understood by a worker having ordinary skill in the art, the term "vicinal" here refers to a crystal plane that is oriented near to a fundamental plane. The angle of the vicinal Ge substrate can range from 0°-20°; the crystal orientation of the Ge substrate can be, for example, 6° towards the nearest <111> plane or any other suitable orientation. On top of the AlAs layer 22 are a GaInP layer 24 having a thickness $t_2$ and a GaAs layer 26 having a thickness $t_3$. The deposition of the AlAs layer 22, the GaInP layer 24 and the GaAs layer 26 can be achieved through any suitable means such as: metal organic chemical vapor deposition (MOCVD), chemical beam epitaxy (CBE), molecular beam epitaxy (MBE), solid phase epitaxy (SPE), hydride vapour phase epitaxy or by other similar hybrid systems or combinations thereof. Although a Ge substrate 20 is shown, any other suitable group IV substrates, such as, e.g., Si, SiGe or SiC substrates, can also be used. Further, as will be understood by the skilled worker, the above also applies in cases where, instead of a group IV substrate, a device requiring transition from a group IV material to a III-V compound is used. Similarly, the AlAs layer can be substituted, without departing from the scope of the present invention, with other III-V compound semiconductor alloys with a high concentration of Al such as, for example, AlN, AlSb or Al(Ga)As.

Figure 2:
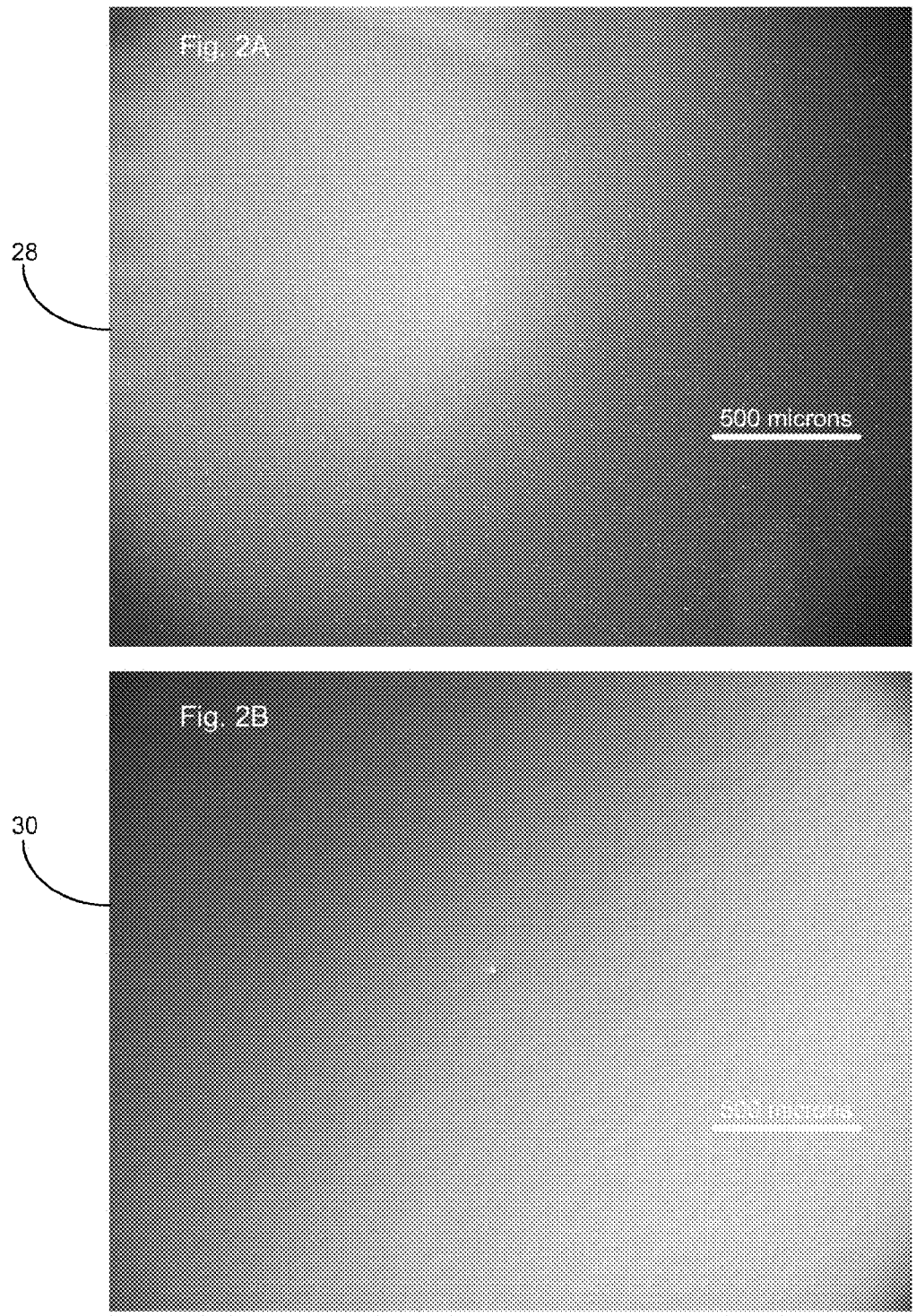
FIGS. 2A and 2B are photographs of embodiments of the present invention with different thickness of an AlAs nucleating layer.

In FIGS. 2A and 2B, the morphology of the structure 18 is compared for two different thicknesses $t_1$ of the AlAs layer 22. In FIGS. 2A and 2B, a test structure 28 corresponds to the structure 18 with $t_1$=0 and a test structure 30 corresponds to test structure 18 with $t_1$=4 monolayers of AlAs. FIGS. 2A and 2B show microscope photographs of the top surface of tests structures 28 and 30 where in each case $t_2$=0.025 µm and $t_3$=0.2 µm. The test structures 28 and 30 were fabricated by MOCVD at temperatures ranging from 650-730° C. with the deposition rates of GaAs, GaInP and AlAs being respectively 4 µm/hr, 0.8 µm/hr and 0.7-0.42 µm/hr.

As seen in FIG. 2A (GaInP on Ge), the number of defects, shown as white speckles, is much higher than if FIG. 2B (AlAs on Ge). The density of defects is of the order of thousands per cm in FIG. 2A and essentially 0 in FIG. 2B. This type of defect is entirely absent on FIG. 2B. The large speckle in the central region of FIG. 2B it is attributed to a foreign particle on the test structure 30, which is not inherent to the nucleation process.

Figure 3:
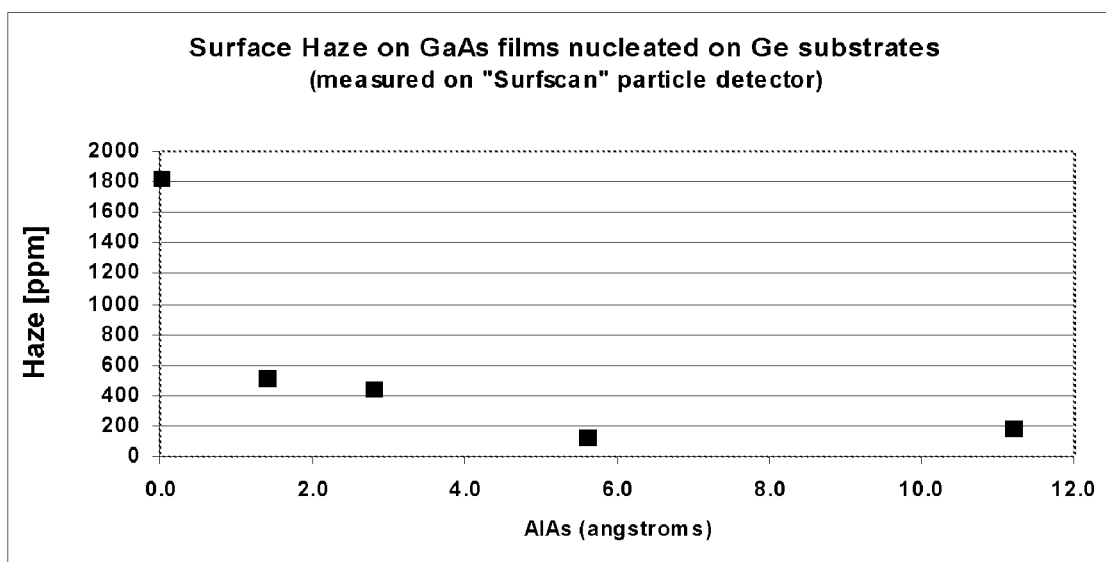
FIG. 3 is a haze measurement of the embodiment of FIG. 1 as a function of thickness of the AlAs nucleating layer.

The graph of FIG. 3 shows a plot of haze for the structures 18 as a function of $t_1$, the thickness of the AlAs layer 22. The measurement was performed with a Surfscan™ haze measurement apparatus manufactured by KLA-Tencor of California. It is very clear from the haze plot that adding just a fraction of a monolayer of AlAs greatly improves the surface morphology of the structure 18.

The reason for this improvement in the morphology of III/V compounds deposited on vicinal Ge substrates with an intermediate AlAs layer 22 between the subsequent III/V compounds is attributable to the following. As shown in FIGS. 4A and 4B, Al atoms are relatively small with respect to As atoms. As such, the Al atoms have an electrochemical potential that favors their positioning at the steps 40 present on the vicinal Ge substrate 20. Thus, introducing Al and As in the growth chamber and allowing sufficient time to pass will see the steps 40 predominantly occupied by Al atoms provided that the surface energy is high enough to allow surface reconfigurations due to the substrate temperature. This allows for the establishment of a homogeneous growth sequence, which leads to morphologically sound samples as shown in FIG. 2B in which the nucleation sequence as been properly established and therefore, the anti-phase domain defects have been greatly reduced. This process is known as a nucleation process and, in the case depicted in FIGS. 4A and 4B, can occur at temperatures typical in depositing AlAs layer epitaxial layers (e.g., 650-730° C.).

Figure 5:
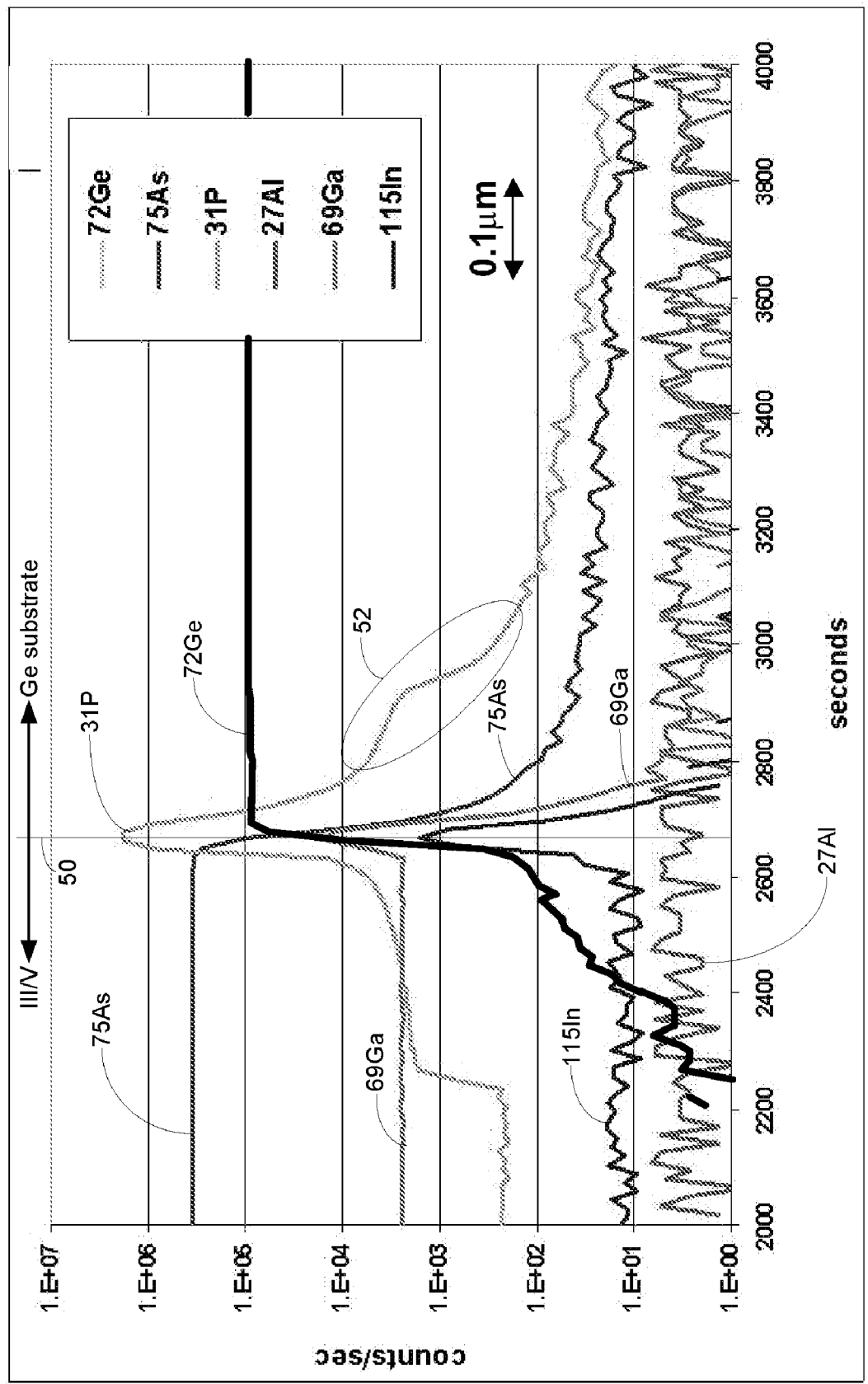
FIG. 5 is a graph of SIMS data for different atomic species of the structure of the embodiment of FIG. 1 when the thickness of the AlAs layer is nil.

FIG. 5 shows a secondary ion mass spectroscopy (SIMS) measurement performed on a test structure similar to that of the test structure 28 of FIG. 2A, i.e., the structure 18 with $t_1=0$. The line 50 indicates the boundary between the Ge substrate 20 and the III/V compound. As seen in the SIMS plots of FIG. 5, atomic masses 72 (Ge), 75 (As), 31 (P), 27 (Al), 69 (Ga) and 115 (In) are measured as a function of exposure time to a beam of Cs atoms accelerated by a 3 kV voltage. A depth scale relating the exposure time to the depth probed by the SIMS beam is shown. Of note is that the germanium isotope 72 is measured instead of the prevalent germanium 74. This is done in order to avoid any interference with the measurement of As, which has an atomic mass of 75.

As indicated by region 52 of the graph, the diffusion of P occurs into the Ge substrate and dominates all other species diffusion. This leads to high levels of n-type conductivity in the Ge substrate, which are not always desirable. The presence of such levels of P in the Ge substrate can lead to low reverse breakdown voltages, which are not tolerable. In such structures, the diffusion of P in the Ge substrate can only be controlled through temperature and thickness (growth time) of the GaInP nucleation layer on the Ge substrate. This makes for a very difficult control of the parameters of the p-n junction in the Ge substrate.

Consequently, structures such as shown in FIG. 2A where $t_1=0$, i.e., structures having GaInP deposited directly on a Ge substrate at a temperature ranging from 650-730° C. at a growth rate of 0.8 μm/hr, not only exhibit poor morphological qualities but also have an essentially uncontrollable n-type doping deep into the Ge substrate. In cases where the doping profile is acceptable, the poor morphology of resulting devices will typically result in lower opto-electronic performance.

Figure 6:
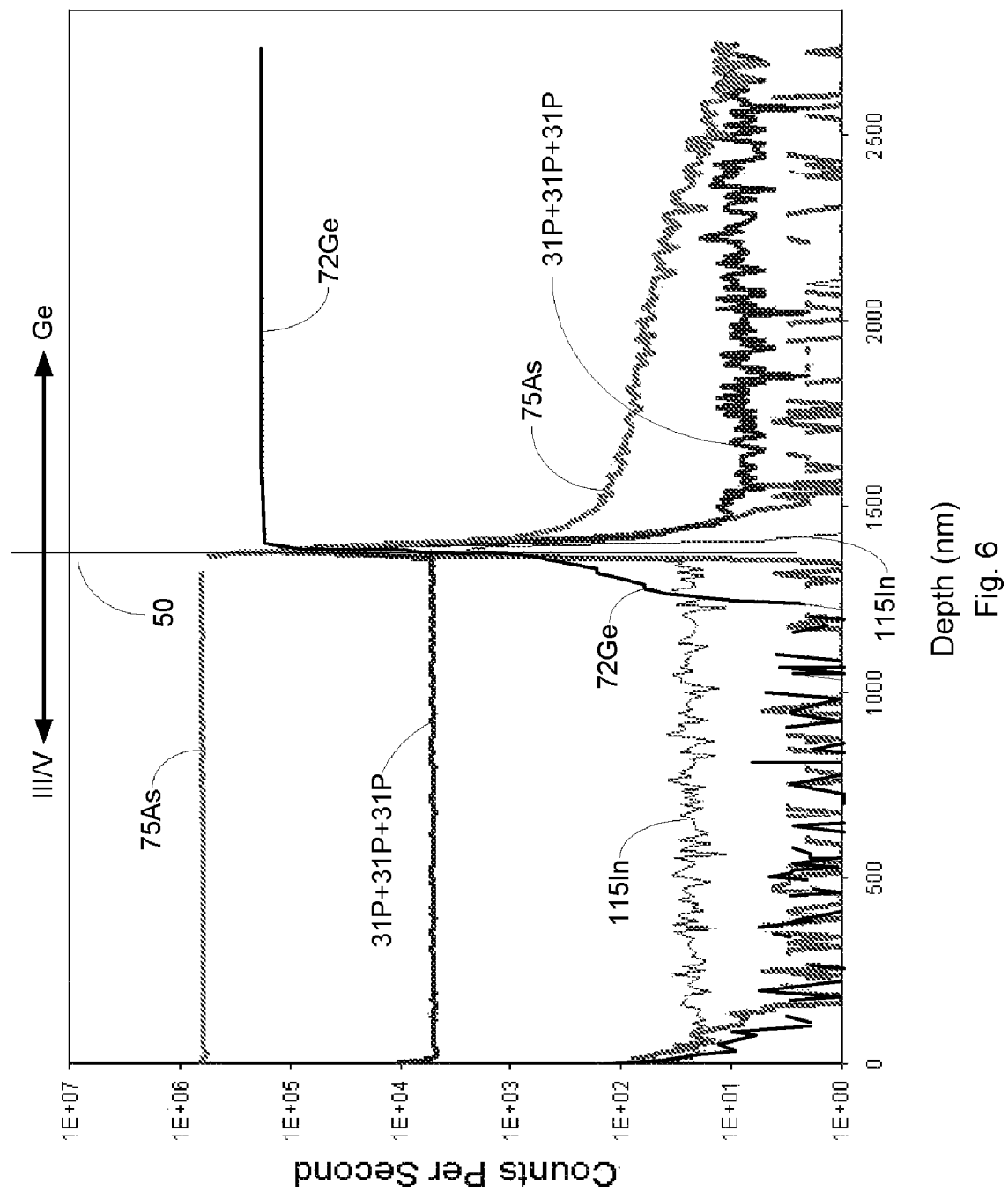
FIG. 6 is a graph of SIMS data for different atomic species of the structure of the embodiment of FIG. 1 when the thickness of the AlAs layer is 11.6 Å.

FIG. 6 shows SIMS measurements performed on the test structure 30 of FIG. 2B, i.e., the sample having $t_1=4$ monolayers (of AlAs) on top the Ge substrate 20. The line 50 indicates the boundary between the Ge substrate 20 and the III/V compound. As seen in the SIMS plots of FIG. 6, atomic masses 72 (Ge), 75 (As), 31+31+31 (triple ion P), 69 (Ga) and 115 (In) are measured as a function of exposure time to a beam of Cs atoms accelerated by a 3 kV voltage.

Clearly, the diffusion of P in the Ge substrate is much smaller than that shown in FIG. 5. The diffusion depth of P in the Ge substrate is approximately 0.02 μm and the diffusion of As in the Ge substrate is approximately 0.10 μm. Thus, when fabricating structures similar to the structure 18 for solar cells, LEDs or other opto-electronic or electronic devices, it is much easier to control the doping profile in the Ge substrate when a high-Al containing alloy such as AlAs is used for the nucleating layer.

FIG. 7 depicts processing steps for structures such as the structure 18 of FIG. 1. At step 60, a nucleating layer containing AlAs is formed on a p-type group IV substrate. At step 62, epitaxial deposition of a III/V layer containing phosphorous is performed together with the formation of a p-n junction near the surface of the substrate. This is followed by step 64, where epitaxial deposition of additional semiconductor materials is performed as required.

Figure 7A:
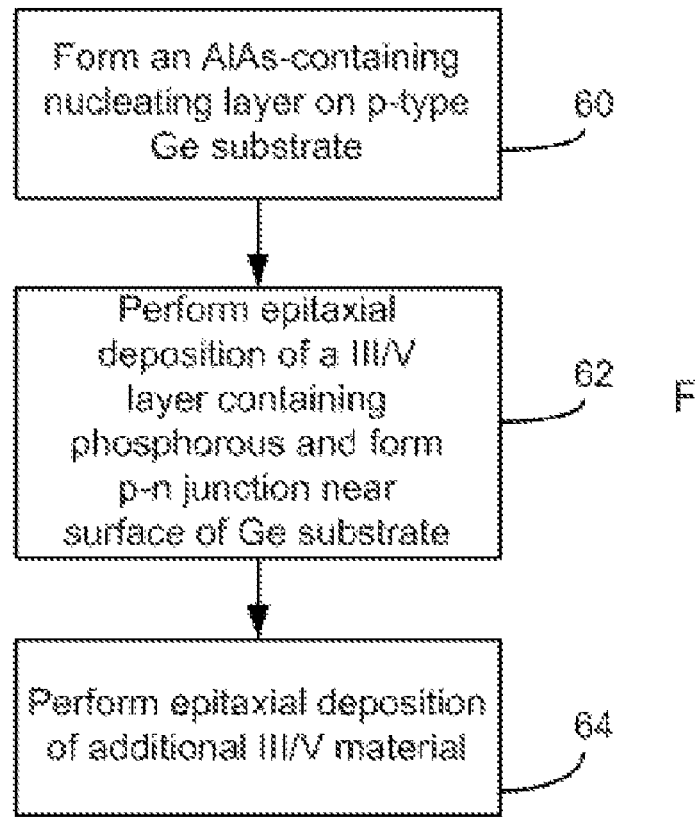
FIG. 7A is a flow chart of a method of the present invention.

FIG. 7A depicts processing steps for structures such as the structure 18 of FIG. 1. At step 60, a nucleating layer containing AlAs is formed on a p-type group IV substrate. At step 62, epitaxial deposition of a III/V layer containing phosphorous is performed together with the formation of a p-n junction near the surface of the substrate. This is followed by step 64, where epitaxial deposition of additional semiconductor materials is performed as required.

Figure 7B:
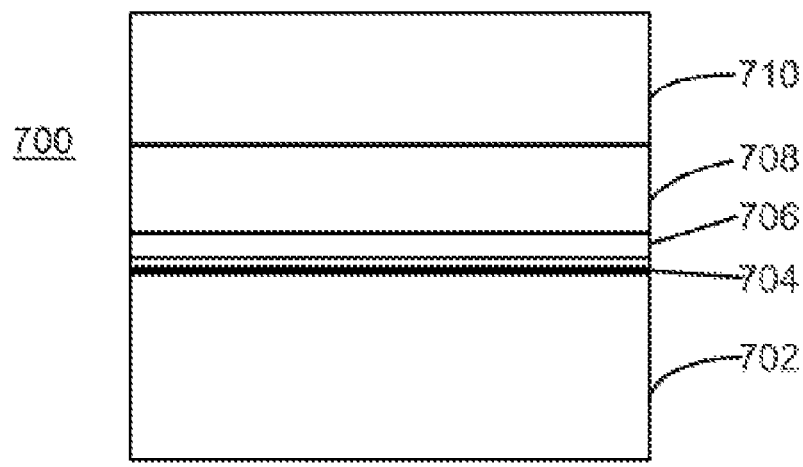
FIG. 7B is an embodiment of a device fabricated in accordance with the method shown at FIG. 7A.

FIG. 7B shows an exemplary semiconductor device 700 fabricated in accordance with the method shown at FIG. 7A. The device 700 includes a p-type Ge substrate 702 having formed therein a p-n junction 704. The Ge substrate 702 has an AlAs nucleation layer 706 formed thereon. The AlAs nucleation layer 706 has a phosphorous-containing III-V layer 708 formed thereon. Further, another layer of III-V material 710 is formed on the phosphorous-containing III-V layer 708.

Figure 8:
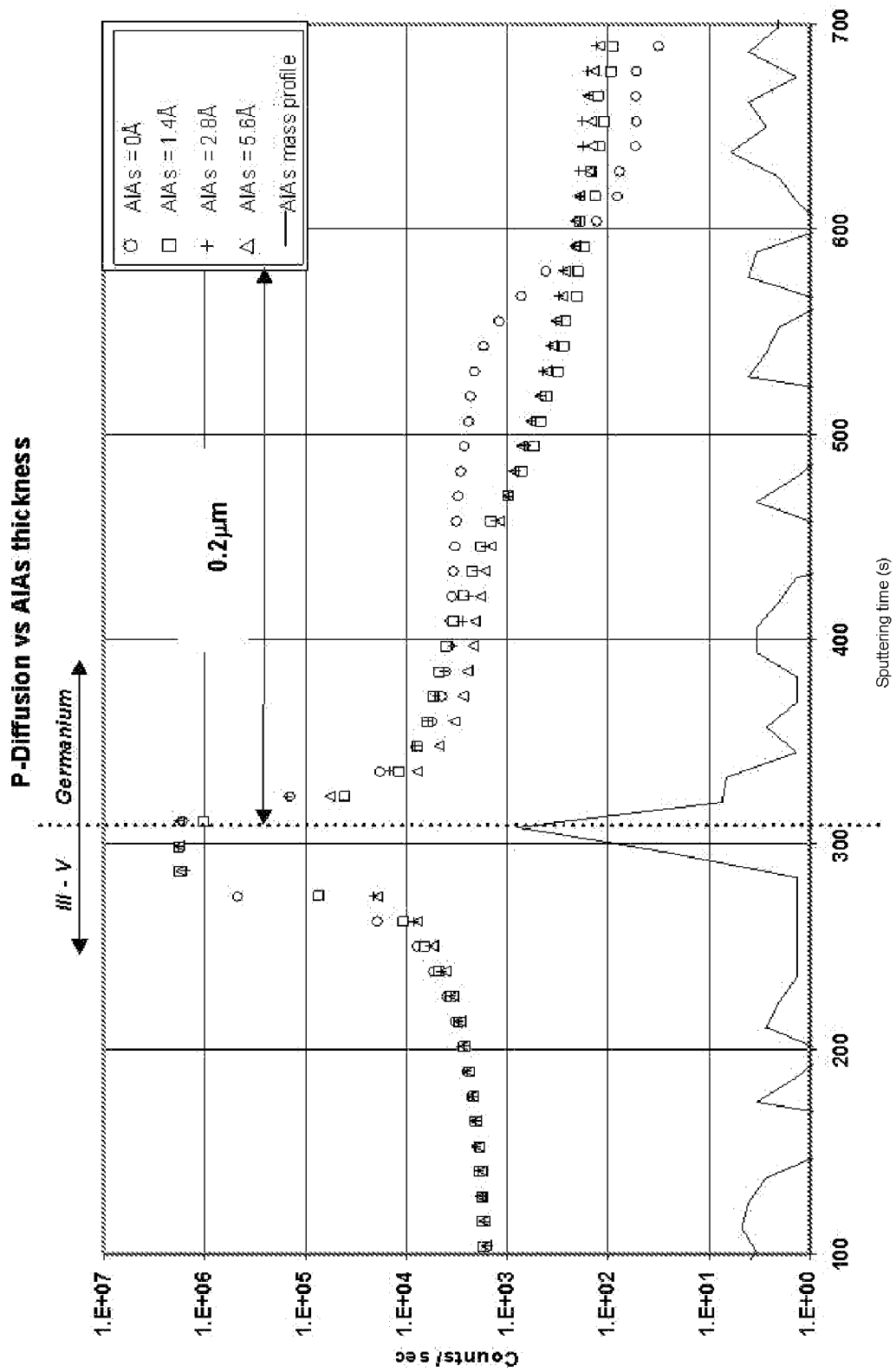
FIG. 8 is a graph of SIMS data for Phosphorous as a function of the thickness of AlAs for the structure of the embodiment of FIG. 1.
Figure 9:
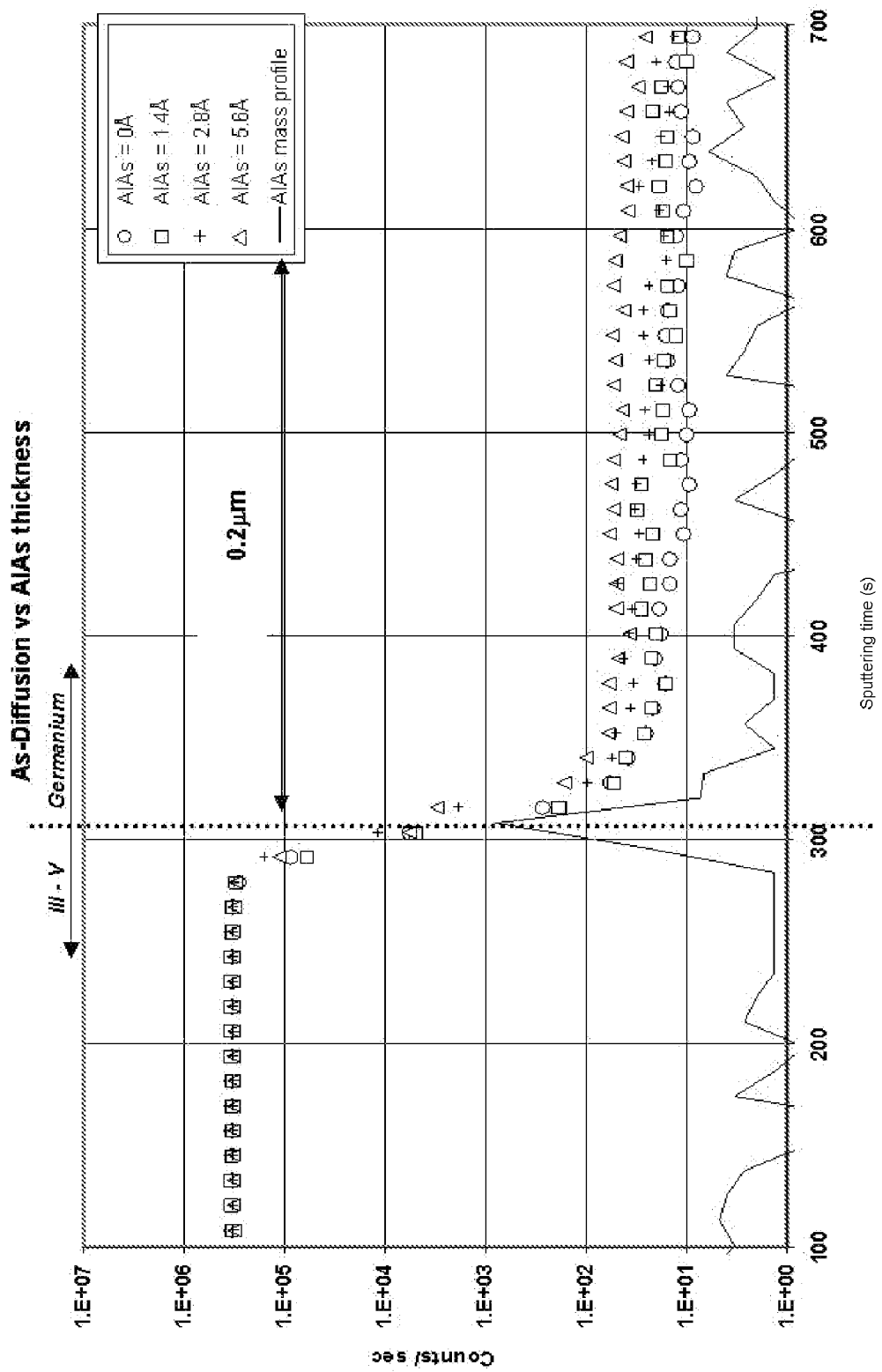
FIG. 9 is a graph of SIMS data for Arsenic as a function of the thickness of AlAs for the structure of the embodiment of FIG. 1.
Figure 10:
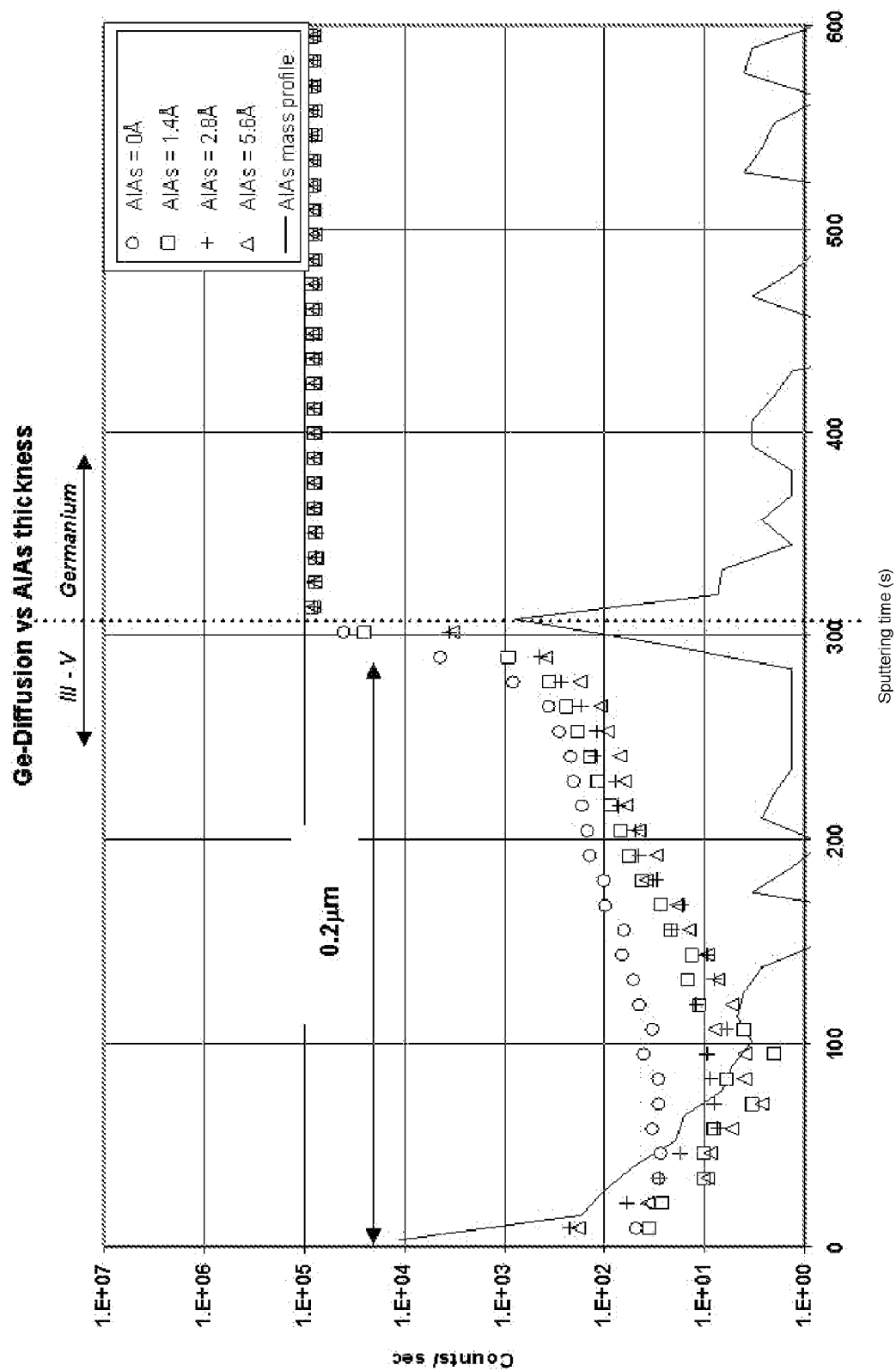
FIG. 10 is a graph of SIMS data for Ge as a function of the thickness of AlAs for the structure of the embodiment of FIG. 1.
Figure 11:
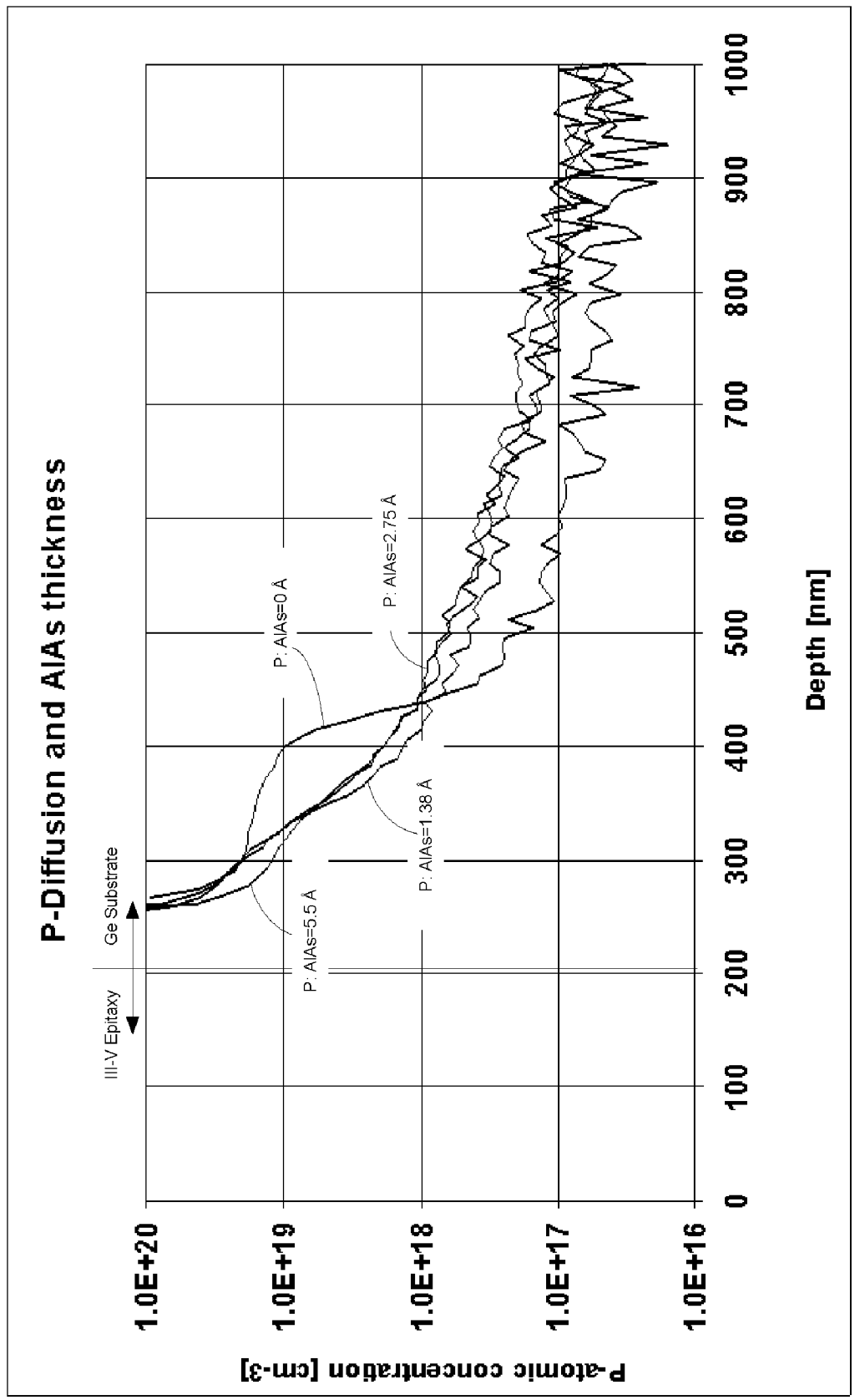
FIG. 11 shows the concentration of Phosphorous as a function sample depth for four different thicknesses of AlAs for the structure of the embodiment of FIG. 1.
Figure 12:
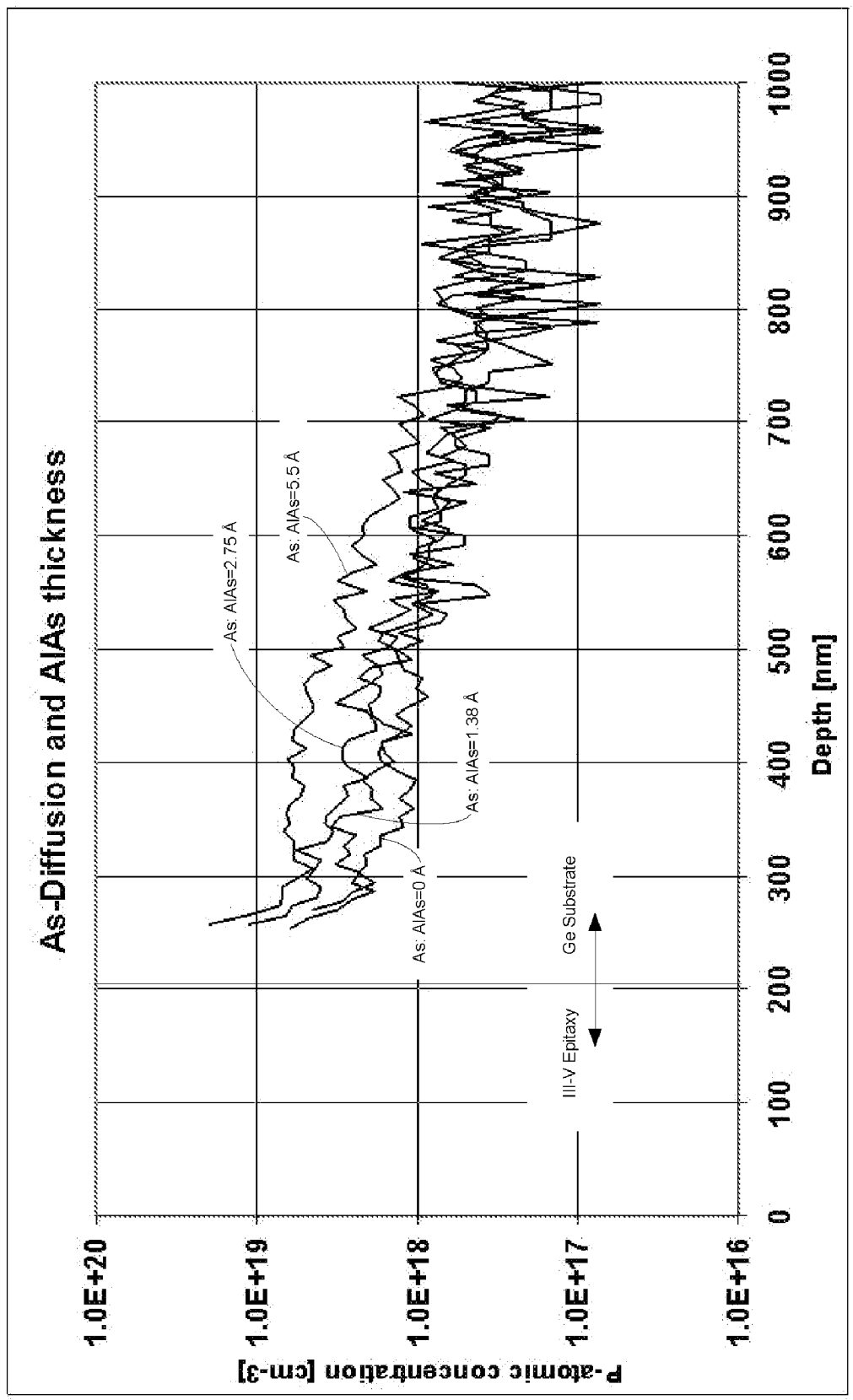
FIG. 12 shows the concentration of Arsenic as a function sample depth for four different thicknesses of AlAs for the structure of the embodiment of FIG. 1.
Figure 13:
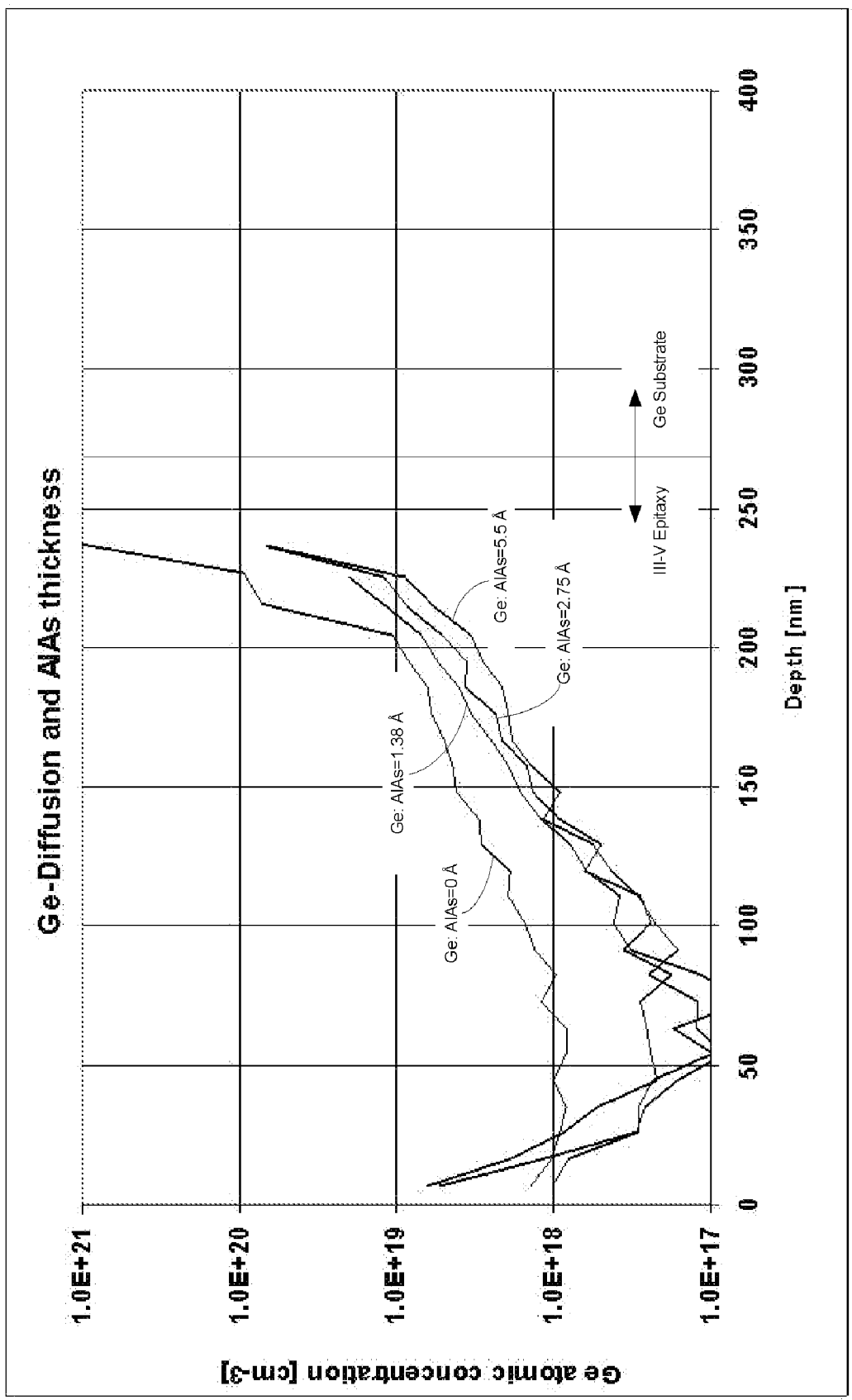
FIG. 13 shows the concentration of Ge as a function sample depth for four different thicknesses of AlAs for the structure of the embodiment of FIG. 1.

FIGS. 8-10 show additional SIMS data taken on structures similar to the structure 18 for four different thicknesses $t_1$ of the AlAs layer 22. FIG. 8 is a P profile showing how much the phosphorous diffusion in the Ge substrate is reduced with a thickness of AlAs of only 1.4 Å. FIG. 9 is an As profile showing very little diffusion of As into the Ge substrate. FIG. 10 is a Ge profile showing that the presence of the AlAs layer significantly reduces the outdiffusion of Ge into the bottom part of the III/V layers. Ge typically is an n-type dopant in III/V materials. Enhanced outdiffusion of Ge will prevent the placement of a p-n junction close to the nucleation layer. Each of FIGS. 8-10 show a trace of AlAs mass profile to identify the location of the interface for the structure deposited with $t_1=1.4$ Å to $t_1=5.6$ Å. In the case of structure 18 deposited with $t_1=0$, there is obviously no Al detected at the interface, but it's location within the semiconductor can be approximated from the 72Ge or 31P profile. FIGS. 11-13 show the same set of data but this time analyzed against material standards which allow the conversion of sputter time to profile depth and count rates to atomic concentrations (corrected for relative abundance of sampled isotopes). As in FIGS. 8-10 they show the effect of the AlAs layer thickness on the atomic concentration of P, Ge and As respectively as a function of sample depth. A vertical stippled line marks the boundary between the III-V layer and the Ge substrate. FIG. 11 shows how the P diffusion into the Ge substrate is reduced with an increase in thickness of the AlAs layer. FIG. 12 shows how the diffusion of As into the Ge substrate can be tailored by choosing an appropriate thickness of the AlAs layer. FIG. 13 shows how the diffusion of Ge into the III-V layer is reduced with an increase in thickness of the AlAs layer. One monolayer of AlAs is sufficient to have the Ge atomic concentration drop to or even below $1 \times 10^{17}$ cm$^{-3}$ within 150 nm from the interface with the Ge substrate.

Figure 14:
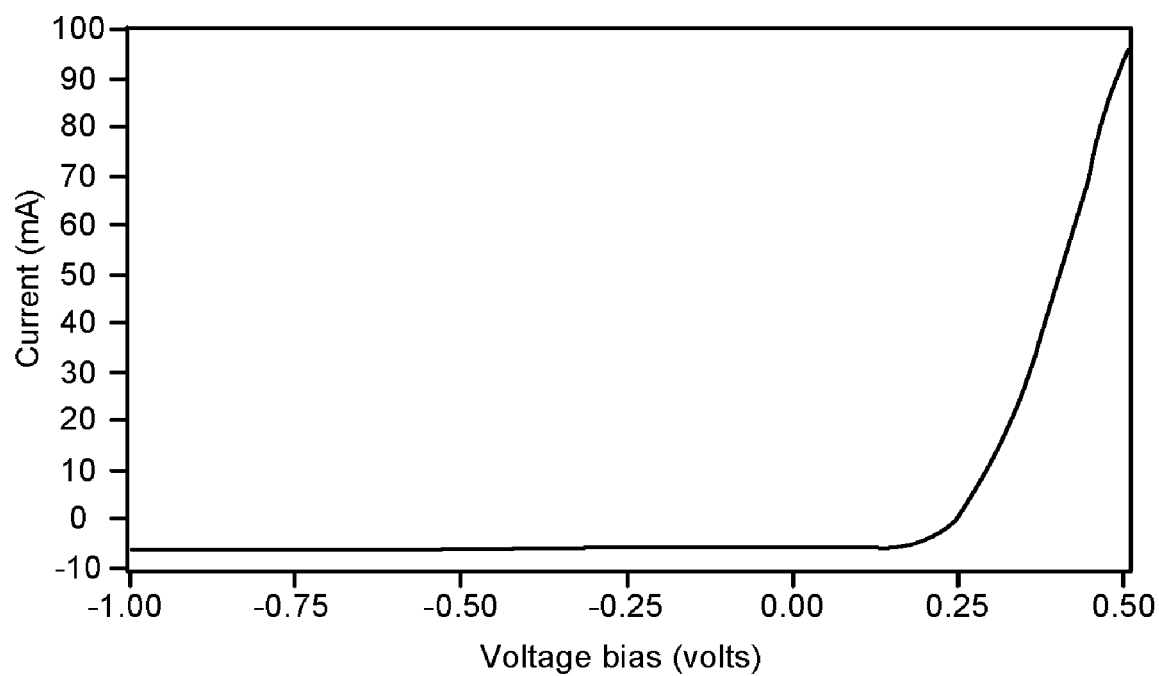
FIG. 14 is a current versus voltage plot of a photovoltaic cell having a structure similar to that shown in the embodiment of FIG. 1.

FIG. 14 shows current plotted as a function of voltage for a Ge solar cell having a structure similar to 18. This Ge solar cell has an open-circuit voltage ($V_{oc}$) of 0.247 mV, a resistance at $V_{oc}$ of 7.2 ohms, a short circuit current density ($J_{sc}$) of −36 mA/cm$^2$, a series resistance of 2 ohms and a fill factor of 60.5%, the fill factor being a measure of the squareness of the current/voltage plot. These parameters are indicative of a Ge diode having a good performance.

Figure 15:
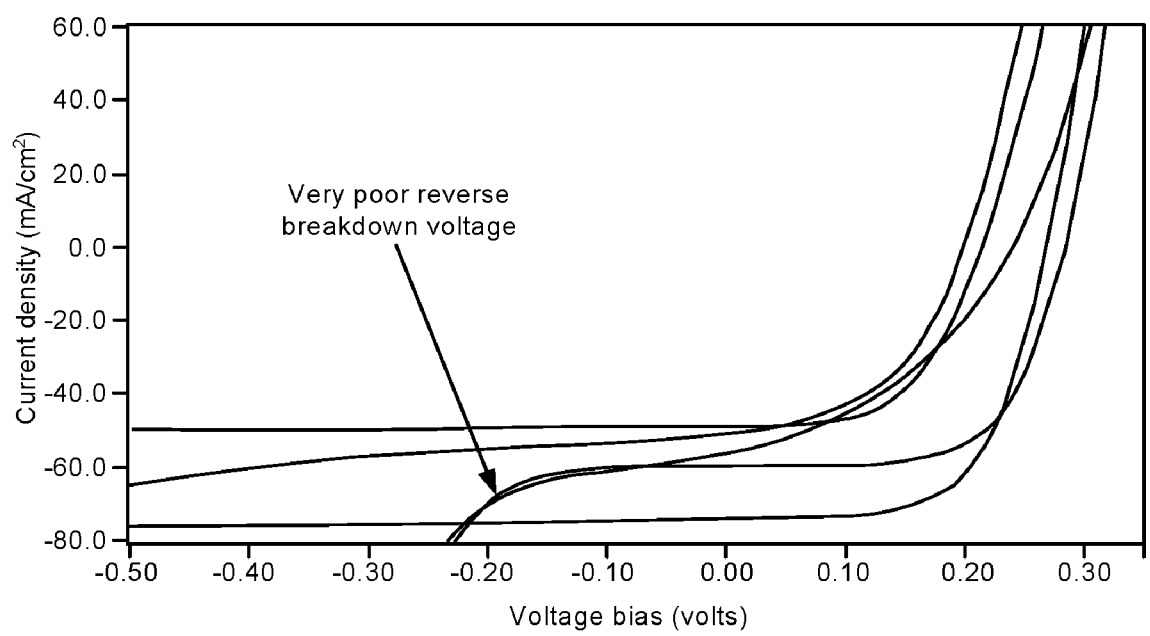
FIG. 15 is a series of current versus voltage plots for photovoltaic cells fabricated without an AlAs nucleation layer and photovoltaic cells fabricated with an AlAs nucleation layer.

FIG. 15 shows a series of plots of current as a function of voltage for Ge solar cells fabricated with and without an AlAs nucleation layer. Two current/voltage plots of solar cells without an AlAs nucleation are indicated by the arrow. For these cells, the $V_{oc}$=280 mV, $J_{sc}$=−36 mA/cm², the series resistance is 2 ohms and the fill factor is 63%. Indicative also of a good diode performance in forward bias, but, as indicated by the arrow, the reverse breakdown voltage is very poor (approximately −0.2 V). The current/voltage plots of solar cells having an AlAs nucleation layer are the ones not showing a breakdown voltage, demonstrating that the nucleation with the AlAs provides overall superior diode performance. Even more importantly is the smoother morphology obtained in the case when the AlAs nucleation layer is used, as this will typically be critical for the performance of the other active elements to be grown above this p/n junction, as is typically done in, for example, solar cells.

Although the above exemplary embodiments show the growth of III/V structures on Ge substrates, a worker of ordinary skill in the art will readily understand that other types of group IV substrates can be used. Similarly, although a binary AlAs compound was mentioned as a nucleating layer, it is to be understood that ternary or quaternary III/V compounds containing AlAs can also be used as nucleating layers without departing from the scope of this invention. As will be understood by a worker having ordinary skill in the art, the present invention is equally applicable to the fabrication of devices on all types of group IV substrates with or without the inclusion of a p-n junction. Further, as will be understood by the skilled worker, other combinations of III-V compounds could be substituted to AlAs when there is a significant difference in size, or electrochemical potential for surface binding, between the group III and the group V atoms. Such III-V compounds include, for example, AlN, AlSb, or, BAs, BSb, GaN, GaSb, InN, or InAs.

As will be understood by a worker skilled in the art, although the above description referred to p-type group IV substrates, other types of group IV substrates can be used. Such substrates include n-type, undoped and semi-insulating substrates.

The present invention provides a method for fabricating electronic or opto-electronic devices having a group IV substrate on which a III/V layer structure is deposited. The method allows for the manufacturing of devices with improved morphology and controlled doping profiles of group V constituents into the group IV substrate and group IV constituents into the III/V layers. Devices fabricated according to the present invention have very good reverse breakdown voltage characteristics as well as excellent forward bias characteristics, in addition to a smooth morphology which is ideal for the epitaxy of additional active layers above the p/n junction produced or not during the nucleation sequence.

The above-described embodiments of the present invention are intended to be examples only. Those of skill in the art may effect alterations, modifications and variations to the particular embodiments without departing from the scope of the invention, which is defined solely by the claims appended hereto.

What is claimed is:

1. A semiconductor device comprising:
   a p-type germanium layer;
   a nucleating layer formed on the germanium layer, the nucleating layer including a III-V compound selected from the group consisting of AlAs, AlSb, AlN, BAs, BSb, GaN, GaSb, and InAs; and
   a first III-V compound layer formed on the nucleating layer, the first III/V compound layer including at least one of GaInP, AlInP, and AlGaInP, the p-type germanium layer having diffused therein phosphorous atoms from the first III-V compound layer, a concentration of the phosphorous atoms diffused in the p-type germanium layer being a function of a thickness of the nucleating layer, the first III-V compound layer having diffused therein germanium atoms from the p-type germanium layer, a concentration of the germanium atoms diffused in the first III-V compound layer being a function of the thickness of the nucleating layer, the semiconductor device having a morphology that is substantially defect-free.

2. The device of claim 1 further comprising a second III-V compound layer formed on the first III/V compound layer.

3. The device of claim 2 wherein, the second III-V compound layer includes GaAs.

4. The device of claim 2 wherein, at least one of the nucleating layer, the first III/V compound layer and the second III/V compound layer is formed by an epitaxial growth process.

5. The device of claim 1 wherein, the p-type germanium layer has a p-n junction proximate the nucleating layer.

6. The device of claim 1 wherein, the device is an electronic device.

7. The device of claim 6 wherein, the electronic device is an opto-electronic device.

8. The device of claim 7 wherein, the opto-electronic device is a solar cell or a light emitting diode.

9. The device of claim 1 wherein, the p-type germanium layer is a p-type germanium substrate.

10. The device of claim 9 wherein, the p-type germanium substrate is a vicinal substrate.

11. The device of claim 10 wherein, the vicinal substrate has an angle ranging from 0° to 20°.

12. The device of claim 1 wherein, the thickness of the nucleating layer ranges from 1 to 20 monolayers.

13. The device of claim 1 wherein the germanium atomic concentration is less than, $1 \times 10^{18}$ cm$^{-3}$ at a distance of substantially 150 nm from the nucleating layer.

14. The device of claim 1 wherein the concentration of the group V atoms diffused from the first III-V compound layer into the p-type germanium layer is less than, or substantially equal to, $1 \times 10^{18}$ cm$^{-3}$ at a distance of substantially 600 nm from the nucleating layer.

15. A method of fabricating a semiconductor structure on a p-type germanium layer, the method comprising steps of:
   forming a nucleating layer on the germanium layer, the nucleating layer including a III-V compound selected from the group consisting of AlAs, AlSb, AlN, BAs, BSb, GaN, GaSb, and InAs; and
   forming a first III-V compound layer on the nucleating layer, the first III/V compound layer including at least one of GaInP, AlInP, and AlGaInP, the p-type germanium layer having diffused therein phosphorous atoms from the first III-V compound layer, a concentration of the phosphorous atoms diffused in the p-type germanium layer being a function of a thickness of the nucleating layer, the first III-V compound layer having diffused therein germanium atoms from the p-type germanium layer, a concentration of the germanium atoms diffused in the first III-V compound layer being a function of the thickness of the nucleating layer, the semiconductor device having a morphology that is substantially defect-free.

16. The method of claim 15 further comprising a step of forming a second III/V compound layer structure on the first III/V compound layer.

* * * * *